United States Patent
Kim et al.

(10) Patent No.: US 7,350,133 B2
(45) Date of Patent: Mar. 25, 2008

(54) ERROR CORRECTION ENCODING APPARATUS AND METHOD AND ERROR CORRECTION DECODING APPARATUS AND METHOD

(75) Inventors: Ki-hyun Kim, Seongnam-si (KR); Yoon-woo Lee, Suwon-si (KR); Sung-hee Hwang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 665 days.

(21) Appl. No.: 10/869,054

(22) Filed: Jun. 17, 2004

(65) Prior Publication Data

US 2005/0022096 A1  Jan. 27, 2005

(30) Foreign Application Priority Data

Jun. 21, 2003  (KR) ............ 10-2003-0040480

(51) Int. Cl.
 *H03M 13/00* (2006.01)
(52) U.S. Cl. ........................................... 714/762
(58) Field of Classification Search ............. 714/762
 See application file for complete search history.

(56) References Cited

U.S. PATENT DOCUMENTS

| | | | |
|---|---|---|---|
| 4,562,487 A | 12/1985 | Hurst, Jr. et al. ......... 386/113 |
| 4,562,577 A | 12/1985 | Glover et al. ............. 714/769 |
| 5,278,815 A | 1/1994 | Mashimo et al. ......... 369/47.21 |
| 6,367,049 B1 | 4/2002 | Van Dijk et al. .......... 714/761 |
| 6,378,100 B1* | 4/2002 | Van Dijk et al. .......... 714/752 |
| 6,604,217 B1* | 8/2003 | Kahlman ................... 714/752 |
| 7,024,616 B2 | 4/2006 | Ohira et al. ............... 714/786 |
| 7,055,082 B2* | 5/2006 | Mori et al. ................ 714/768 |
| 7,058,875 B2* | 6/2006 | Jeon et al. ................. 714/769 |
| 7,200,795 B2* | 4/2007 | Stek et al. ................. 714/776 |
| 2002/0157055 A1* | 10/2002 | Coene et al. .............. 714/758 |

FOREIGN PATENT DOCUMENTS

EP  0 496 429 A2  1/1992

* cited by examiner

*Primary Examiner*—Shelly Chase
(74) *Attorney, Agent, or Firm*—Stein, McEwen & Bui, LLP

(57) ABSTRACT

An error correction encoding method including generating error correction code data, which is a predetermined number of bytes long, by error-correction-encoding user data in a predetermined manner; generating burst indicator subcode data, which is a predetermined number of bytes long and is used to detect errors that have occurred in the user data; dividing the error correction code data into a plurality of sub-error correction code data each having a length that is less than the error correction code data; dividing the burst indicator subcode data into a plurality of sub-burst indicator subcode data having a length that is less than a minimal data unit that is error-correction-encodable; and alternately arranging the plurality of sub-error correction code data and the plurality of sub-burst indicator subcode data.

37 Claims, 5 Drawing Sheets

ERROR CORRECTION ENCODING APPARATUS AND METHOD AND ERROR CORRECTION DECODING APPARATUS AND METHOD

CROSS-REFERENCE TO RELATED APPLICATION

This application claims the priority of Korean Patent Application No. 2003-40480, filed on Jun. 21, 2003, in the Korean Intellectual Property Office, the disclosure of which is incorporated herein by reference.

BACKGROUND OF THE INVENTION

1. Field of the Invention

The present invention relates to error correction encoding and decoding technologies, and more particularly, to an error correction encoding method and apparatus, and an error correction decoding method and apparatus, which can more precisely detect errors that have occurred in error-correction-encoded data.

2. Description of the Related Art

There are various types of data storage devices, including magnetic disks, such as a floppy disk and a hard disk, magnetic tapes, semiconductor memory chips, such as ROM and RAM, and optical disks, such as a CD and a DVD, etc.

Optical disks have been widely adopted in recent years because their storage capability has rapidly increased due to developments in semiconductor and signal processing technologies. In addition, optical discs are relatively inexpensive. Data is recorded on optical disks on a block-by-block basis. For example, each block is an error correction code (ECC) block, which is a minimal data unit that is error-correctable. Because an optical disk may be scratched or damaged by dust, data is error-correction-encoded in a predetermined manner before being recorded on the optical disk.

A Reed-Solomon code is often used to error-correction-encode data. For example, a Reed-Solomon code (248, 216,32) generates a 248-byte codeword by adding a 32-byte parity to a 216-byte user data to correct errors in the 216-byte user data.

In the case of error-correction-decoding error-correction-encoded data, additional information, for example, burst indicator subcode (BIS) data, is inserted between adjacent Reed-Solomon codes in order to more easily detect erroneous parts of the error-correction-encoded data. The BIS data has such a high data rate that it can correct most of the errors that have occurred in the error-correction-encoded data.

FIG. 1 illustrates the format of conventional error-correction-encoded data, which comprises ECC data C0 through C3 and BIS data B0 through B2. Referring to FIG. 1, each of the ECC data C0 through C3 is 38 bytes long, and each of the BIS data is 1 byte long. The BIS data B0 through B2 are inserted between C0 and C1, between C1 and C2, and between C2 and C3, respectively.

The BIS data B0 through B2 are error-correction-decoded first. If one of the ECC data C0 through C3 is determined as being surrounded by two consecutive erroneous BIS data, the corresponding ECC data is considered erroneous and it is error-correction-decoded, thereby increasing ECC data error correctability. These types of error correction encoding and decoding methods, using a conventional BIS data structure and a conventional Reed-Solomon coding method, are disclosed in U.S. Pat. No. 6,367,049.

The conventional error correction encoding and decoding methods, however, may falsely determine ECC data as being erroneous if the ECC data is surrounded by two consecutive erroneous BIS data.

SUMMARY OF THE INVENTION

An aspect of the invention provides an error correction encoding method and apparatus, which can more precisely detect erroneous data.

An aspect of the invention also provides an error correction decoding method and apparatus, which can more precisely detect erroneous data.

According to an aspect of the invention, there is provided an error correction encoding method. The error correction encoding method involves generating error correction code (ECC) data, which is M bytes long, by error-correction-encoding user data in a predetermined manner; generating burst indicator subcode (BIS) data, which is N bytes long and is used to detect errors that have occurred in the user data; dividing the ECC data into a plurality of sub-ECC data each having a length that is less than the ECC data; dividing the BIS data into a plurality of sub-BIS data having a length that is less than a minimal data unit that is error-correction-encodable; and (e) alternately arranging the plurality of sub-ECC data and the plurality of sub-BIS data.

According to another aspect of the invention, there is provided an error correction encoding apparatus. The error correction encoding apparatus includes an error correction encoder, which generates error correction code (ECC) data, which is M bytes long, by error-correction-encoding user data in a predetermined manner, and generates burst indicator subcode (BIS) data, which is N bytes long and is used to detect errors that have occurred in the user data; a sub-data generator, which divides the ECC data into a plurality of sub-ECC data each having a length that is less than the ECC data and divides the BIS data into a plurality of sub-BIS data having a length that is less than a minimal data unit that is error-correction-encodable; and a data synthesizer, which alternately arranges the plurality of sub-ECC data and the plurality of sub-BIS data.

According to another aspect of the invention, there is provided an error correction decoding method. The error correction decoding method involves receiving digital data, in which a plurality of sub-ECC data and a plurality of sub-BIS data are alternately arranged; generating BIS data having the same length as a minimal data unit that is error-correction-decodable by combining every predetermined number of sub-BIS data together; error-correction-decoding the BIS data in a predetermined manner; determining which sub-BIS data of the BIS data is erroneous by comparing the error-correction-decoded BIS data with the BIS data yet to be error-correction-decoded; and determining sub-ECC data surrounded by two consecutive erroneous sub-BIS data as being erroneous.

According to another aspect of the invention, there is provided an error correction decoding apparatus. The error correction decoding apparatus includes a BIS data generator, which receives digital data, in which a plurality of sub-ECC data and a plurality of sub-BIS data are alternately arranged, and generates BIS data having the same length as a minimal data unit that is error-correction-decodable by combining every predetermined number of sub-BIS data together; an error correction decoder, which error-correction-decodes the BIS data in a predetermined manner; and an error determiner, which determines which sub-BIS data of the BIS data is erroneous by comparing the error-correction-decoded BIS data with the BIS data yet to be error-correction-decoded, and determines sub-ECC data surrounded by two consecutive erroneous sub-BIS data as being erroneous.

Additional aspects and/or advantages of the invention will be set forth in part in the description which follows and, in part, will be obvious from the description, or may be learned by practice of the invention.

BRIEF DESCRIPTION OF THE DRAWINGS

The above and/or other features and advantages of the present invention will become more apparent by describing in detail exemplary embodiments thereof with reference to the attached drawings in which.

DETAILED DESCRIPTION OF THE PREFERRED EMBODIMENTS

Figure 1:
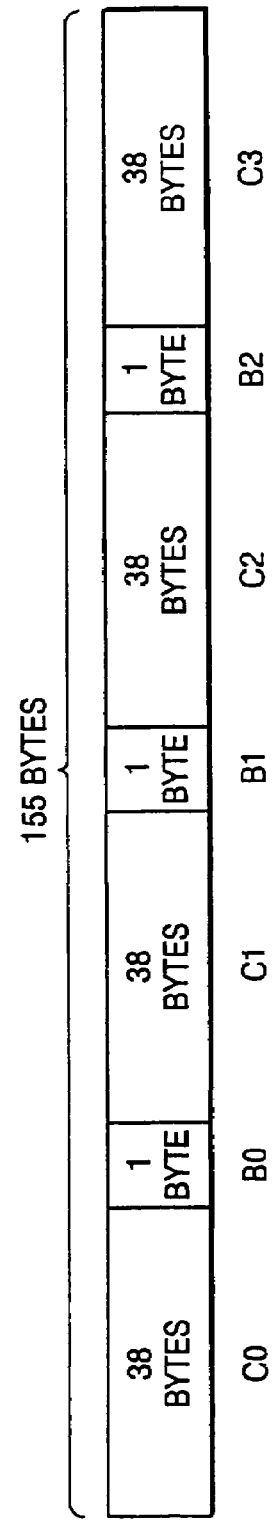
FIG. 1 is a diagram illustrating the format of conventional error-correction-encoded data, which comprises error correction code (ECC) data and burst indicator subcode (BIS) data.

Reference will now be made in detail to the embodiments of the present invention, examples of which are illustrated in the accompanying drawings, wherein like reference numerals refer to the like elements throughout. The embodiments are described below to explain the present invention by referring to the figures.

Referring back to FIG. 1, which illustrates the format of conventional error-correction-encoded data, burst indicator subcode (BIS) data B0 is inserted between error correction code (ECC) data C0 and ECC data C1, BIS data B1 between the ECC data C1 and ECC data C2, and BIS data B2 between the ECC data C2 and the ECC data C3. Each of the BIS data B0 through B2 is 1 byte long. It is understood that the BIS data is not limited to being 1 byte long. In the invention, each of the BIS data B0 through B2 is divided into a plurality of sub-BIS data each having a length that is less than each of the BIS data B0 through B2, and the plurality of sub-BIS data are arranged in each of the ECC data C1 through C3 at regular intervals, thereby more precisely locating ECC data, in which an error has occurred during an error-correction-decoding process. Due to the sub-BIS data, each of the ECC data C1 through C3, which is 38 bytes long, is divided into a plurality of sub-ECC data.

Figure 2:
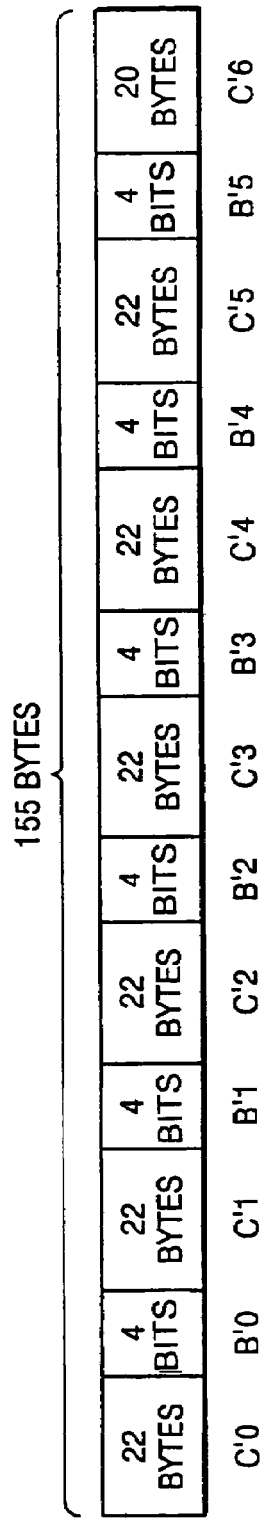
FIG. 2 is a diagram illustrating the format of error-correction-encoded data according to an aspect of the invention, which comprises sub-ECC data and sub-BIS data.

FIG. 2 is a diagram illustrating the format of error-correction-encoded data according to an aspect of the invention, which comprises sub-ECC data C'0 through C'6 and sub-BIS data B'0 through B'5. Referring to FIG. 2, each of the sub-ECC data C'0 through C'5 is 22 bytes long, and the sub-ECC data C'6 is 20 bytes long. Each of the sub-BIS data is 4-bit long. It is understood that each of the C'0 through C'5, C'6, and B0 through B'5 may be different lengths from those discussed above.

Each of the ECC data C0 through C3 of FIG. 1 is divided into the sub-ECC data C'0 through C'6 of FIG. 2. In addition, the BIS data B0 of FIG. 1 is divided into the sub-BIS data B'0 and B'1 of FIG. 2, the BIS data B1 into the sub-BIS data B'2 and B'3, and the BIS data B2 into the sub-BIS data B'4 and B'5.

The sub-BIS data B'0 and B'1 are combined together into 1-byte BIS data, the sub-BIS data B'2 and B'3 are combined together into 1-byte BIS data, and the sub-BIS data B'4 and B'5 are combined together into 1-byte BIS data, and then each of the 1-byte BIS data is error-correction-decoded. Thereafter, it is determined which sub-BIS data are erroneous by comparing the error-correction-decoded BIS data with their respective counterparts yet to be error-correction-decoded.

Accordingly, it is possible to detect which part of error-correction-encoded data is erroneous on a sub-ECC data-by-sub-ECC data basis by detecting erroneous sub-BIS data and determining sub-ECC data surrounded by two consecutive erroneous sub-BIS data as being erroneous.

Figure 3:
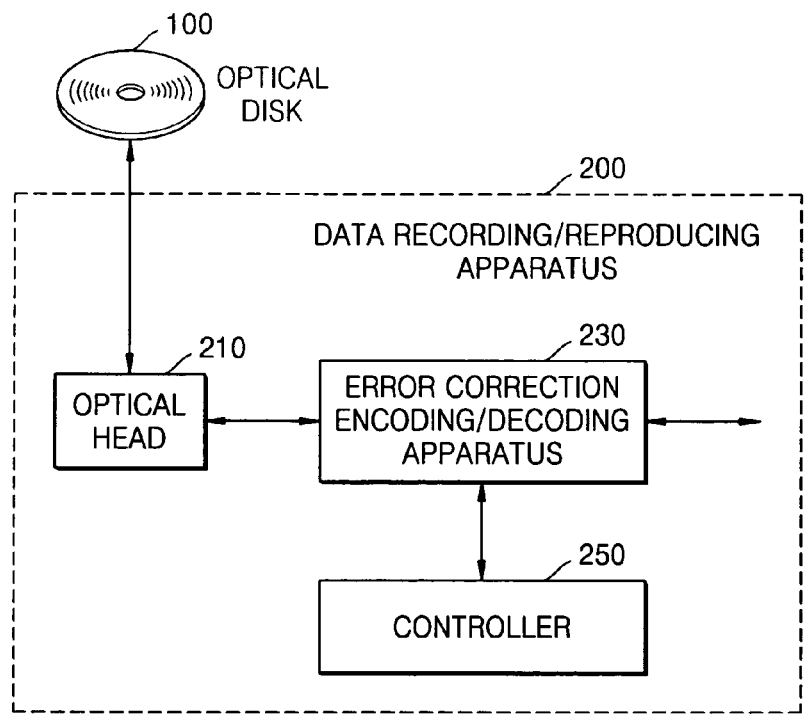
FIG. 3 is a block diagram of a data recording/reproducing apparatus that performs error correction encoding and decoding methods according to an aspect of the invention.

FIG. 3 is a block diagram of a data recording/reproducing apparatus 200 that performs error correction encoding and decoding methods according to an aspect of the invention. Referring to FIG. 3, the data recording/reproducing apparatus 200 includes an optical head 210, an error correction encoding and decoding apparatus 230, and a controller 250. The optical head 210 records data on or reads data from an optical disk 100 under the control of the controller 250. The error correction encoding and decoding apparatus 230 performs an error correction encoding method on data to be recorded on the optical disk 100 under the control of the controller 250 and/or performs an error correction decoding method on data read from the optical disk 100 under the control of the controller 250. The error correction encoding and decoding methods are compatible with each other. The controller 250 controls the error correction encoding and decoding apparatus 230 and the optical head 210 so that data is recordable on and/or readable from the optical disk 100.

Figure 4:
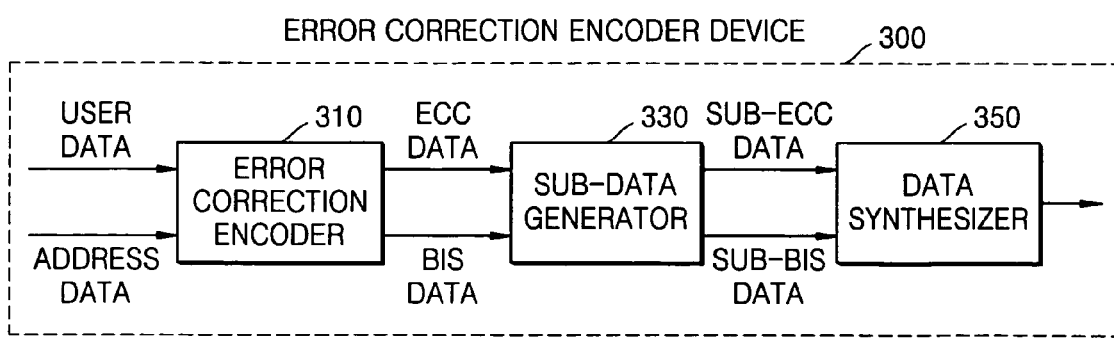
FIG. 4 is a block diagram of an error correction encoding apparatus according to an aspect of the invention.

FIG. 4 is a block diagram of an error correction encoding apparatus 300 according to an aspect of the invention. The error correction encoding apparatus 300 is included in the error correction encoding and decoding apparatus 230 and performs an error correction encoding method. Referring to FIG. 4, the error correction encoding apparatus 300 includes an error correction encoder 310, a sub-data generator 330, and a data synthesizer 350.

Figure 5:
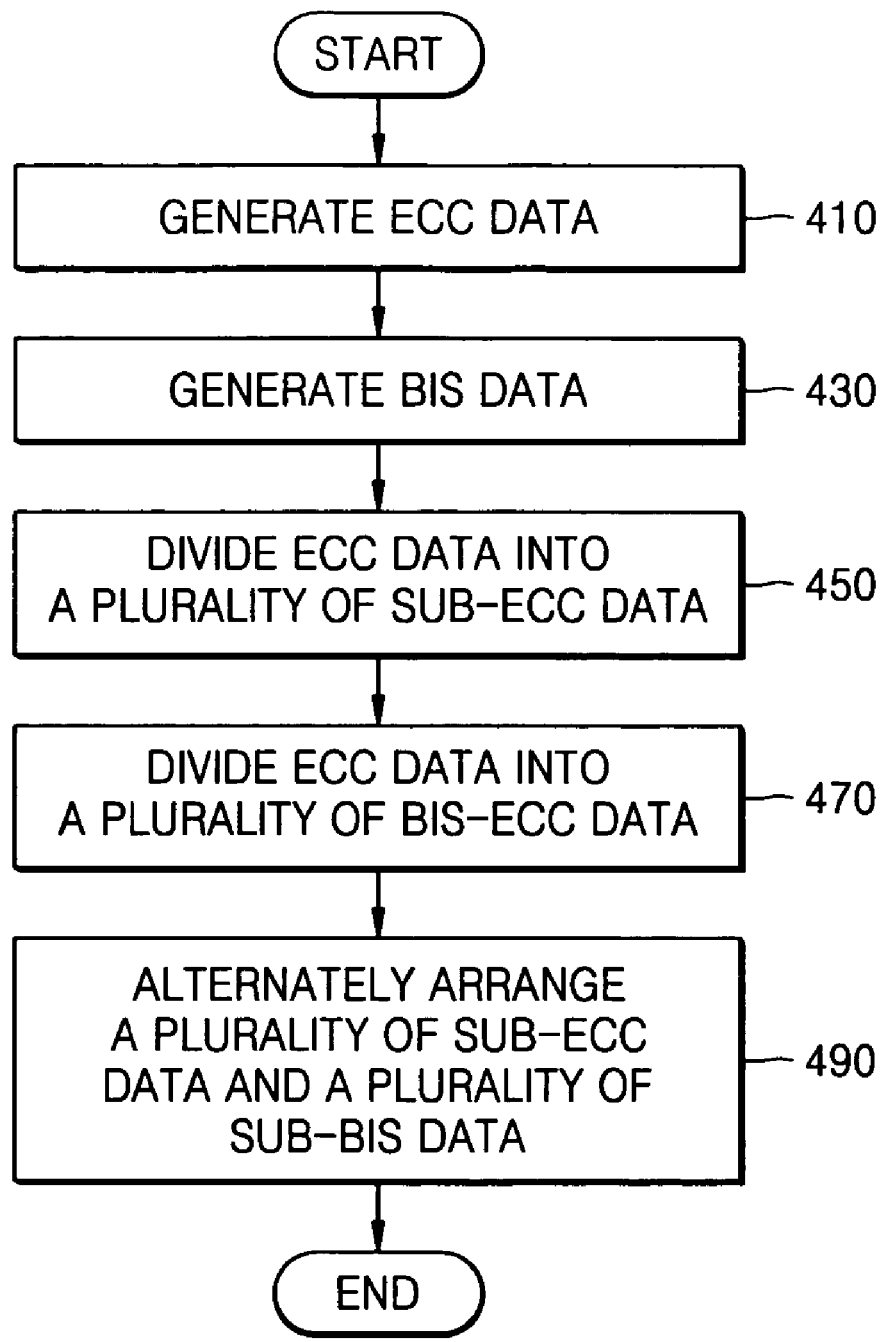
FIG. 5 is a flowchart of an error correction encoding method according to an aspect of the invention.

The operation of the error correction encoding apparatus 300 will now be described more fully with reference to FIG. 5. FIG. 5 is a flowchart of an error correction encoding method according to an aspect of the invention. In operation 410, the error correction encoder 310 receives user data and error-correction-encodes the received user data in a predetermined manner, thereby generating ECC data, which is M bytes long. In operation 430, the error correction encoder 310 receives address data that specifies an address of an optical disk, at which the user data is to be recorded, and error-correction-encodes the received address data, thereby generating BIS data, which is N bytes long. Here, the BIS data is used for detecting where in the ECC data errors have occurred. As shown in FIG. 2, M and N may be set to (but not restricted to) 152 and 3 bytes, respectively.

The error correction encoder 310 may use a Reed-Solomon encoding method to error-correction-encode the user data and the address data, thereby generating the ECC data and the BIS data. The Reed-Solomon encoding method is disclosed in greater detail in U.S. Pat. No. 6,367,049. The error correction encoder 310 is not limited to using the Reed-Solomon encoding method.

The sub-data generator 330 receives the ECC data and the BIS data from the error correction encoder 310, divides the ECC data into a plurality of sub-ECC data each having a length that is less than the ECC data in operation 450, and divides the BIS data into a plurality of sub-BIS data each having a length that is less than the BIS data in operation 470. It is understood that the BIS data may be divided prior to the ECC data.

Referring to FIG. 2, the ECC data, which is 152 bytes long, is divided into the sub-ECC data C'0 through C'6. Each of the sub-ECC data C'0 through C'5 is 22 bytes long, and the sub-ECC data C'6 is 20 bytes long. The BIS data, which is 3 bytes long, is divided into the sub-BIS data B'0 through B'5. Each of the sub-BIS data B'0 through B'5 is 4-bits long. However, the lengths of the ECC data, each of the sub-ECC data comprising the ECC data, the BIS data, and each of the sub-BIS data comprising the BIS data are not restricted to the values set forth herein.

In the Reed-Solomon technique, data is error-correction-encoded or error-correction-decoded on a one byte-by-one byte basis. Therefore, data shorter than 1 byte cannot be error-correction-encoded or error-correction-decoded using the Reed-Solomon technique. In the invention, the BIS data is split into the plurality of sub-BIS data each shorter than 1 byte, and the plurality of sub-BIS data are respectively arranged among the plurality of sub-ECC data having a length that is less than the ECC data.

In operation 490, the data synthesizer 350 receives the plurality of sub-ECC data and the plurality of sub-BIS data from the sub-data generator 330 and alternately arranges the plurality of sub-ECC data and the plurality of sub-BIS data, thereby completing the entire error-correction-encoding process and obtaining error-correction-encoded data. Thereafter, the error-correction-encoded data is recorded on the optical disk.

Figure 6:
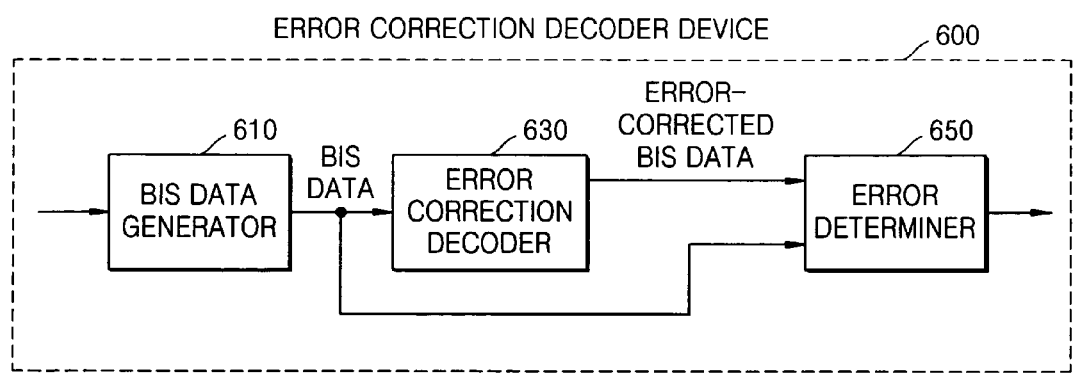
FIG. 6 is a block diagram of an error correction decoding apparatus according to an aspect of the invention.
Figure 7:
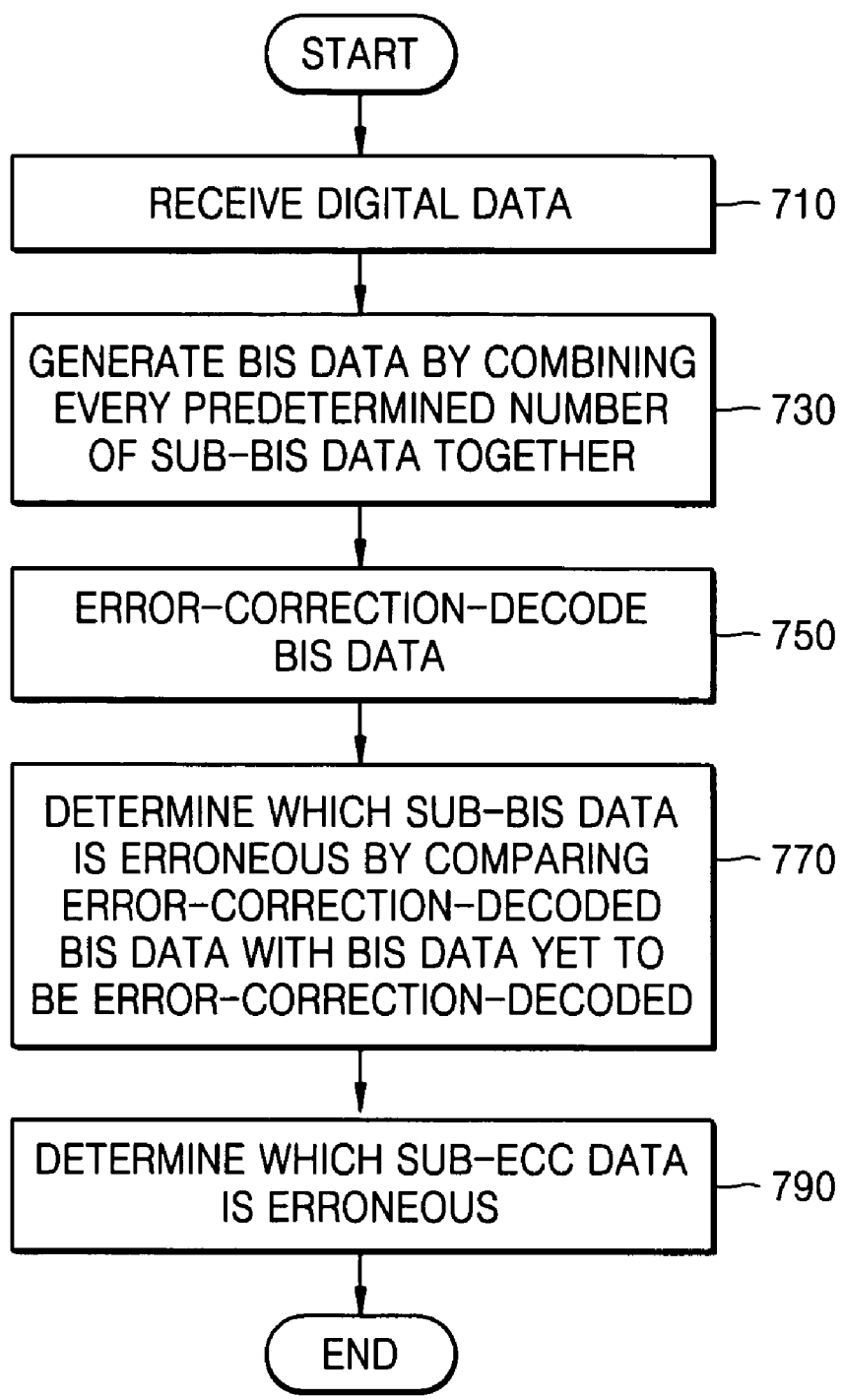
FIG. 7 is a flowchart of an error correction decoding method according to an aspect of the invention.

FIG. 6 is a block diagram of an error correction decoding apparatus 600 according to an aspect of the invention. The error correction decoding apparatus 600 is provided in the error correction encoding and decoding apparatus 230 and performs an error correction decoding method. Referring to FIG. 6, the error correction decoding apparatus 600 includes a BIS data generator 610, an error correction decoder 630, and an error determiner 650. The operation of the error correction decoding apparatus 600 will now be described more fully with reference to FIG. 7. FIG. 7 is a flowchart of an error correction decoding method according to an aspect of the invention.

In operation 710, the BIS data generator 610 receives digital data, in which a plurality of sub-ECC data and a plurality of sub-BIS data are alternately arranged, as shown in FIG. 2, from a data storage medium, such as an optical disk. In operation 730, the BIS data generator 610 combines consecutive groups of sub-BIS data, the groups being a predetermined number of sub-BIS data in length, into BIS data having a predetermined length required in the error correction decoding method.

Here, the digital data is error-correction-decoded in the same manner it has been error-correction-encoded; however, it is not limited to such a process. The Reed-Solomon technique is generally used to error-correction-encode or error-correction-decode data. In the Reed-Solomon technique, a minimal data unit that is error-correction-encodable and/or error-correction-decodable has a 1-byte length. For example, if each sub-BIS data is 4-bits long, every two sub-BIS data are combined together to generate 1-byte BIS data.

In operation 750, the error correction decoder 630 receives BIS data having a predetermined length, which is required in the error correction decoding method according to an aspect of the invention, from the BIS data generator 610 and error-correction-decodes the received BIS data in a predetermined manner. The error correction decoder 630 may use a Reed-Solomon decoding method to error-correction-decode the BIS data.

In operation 770, the error determiner 650 receives the error-correction-decoded BIS data from the error correction decoder 630, receives the BIS data yet to be error-correction-decoded from the BIS data generator 610, compares the error-correction-decoded BIS data and the BIS data yet to be error-correction-decoded, thereby determining which sub-BIS data are erroneous.

In operation 790, the error determiner 650 determines sub-ECC data surrounded by two consecutive erroneous sub-BIS data as being erroneous.

As described above, according to the invention, it is possible to more precisely detect the location of data in which an error has occurred during an error-correction-decoding process. In addition, the invention is easily realized by slightly modifying the structures of conventional Reed-Solomon and BIS codes.

Although a few embodiments of the invention have been shown and described, it would be appreciated by those skilled in the art that changes may be made in these embodiments without departing from the principles and spirit of the invention, the scope of which is defined in the claims and their equivalents.

What is claimed is:

1. An error correction encoding method comprising:
generating error correction code data, which has first bytes, by error-correction-encoding user data in a predetermined manner;
generating burst indicator subcode-data, which has second bytes and is used to detect errors that have occurred in the user data;
dividing the error correction code data into a plurality of sub-error correction code data each having a length that is less than the error correction code data;
dividing the burst indicator subcode data into a plurality of sub-burst indicator subcode data having a length that is less than a minimal data unit that is error-correction-encodable; and
alternately arranging the plurality of sub-error correction code data and the plurality of sub-burst indicator subcode; and
recording the arranged sub-error correction code data and sub-burst indicator code data onto a recording medium.

2. The error correction encoding method of claim 1, wherein the minimum data unit that is error-correction-encodable is 1 byte, and the burst indicator subcode data is divided into a plurality of sub-burst indicator subcode data each having a length that is less than 1 byte.

3. The error correction encoding method of claim 2, wherein the burst indicator subcode data is divided into a plurality of sub-burst indicator subcode data each having a 4-bit length.

4. The error correction encoding method of claim 1, wherein the error correction code data is generated by error-correction-encoding the user data using a Reed-Solomon encoding method.

5. An error correction encoding apparatus comprising:
an error correction encoder, to generate error correction code data, which has first bytes, by error-correction-encoding user data in a predetermined manner, and to generate burst indicator subcode-data, which has second bytes and is used to detect errors that have occurred in the user data;
a sub-data generator, to divide the error correction code data into a plurality of sub-error correction code data each having a length that is less than the error correction code data and to divide the burst indicator subcode data into a plurality of sub-burst indicator subcode data having a length that is less than a minimal data unit that is error-correction-encodable; and
a data synthesizer to alternately arrange the plurality of sub-error correction code data and the plurality of sub-burst indicator subcode data.

6. The error correction encoding apparatus of claim 5, wherein the minimum data unit that is errorcorrection-encodable is 1 byte, and the error correction encoder divides the burst indicator subcode data such that each of the plurality of sub-burst indicator subcode data is a length of less than 1 byte.

7. The error correction encoding apparatus of claim 6, wherein the sub-data generator divides the burst indicator subcode data such that each of the plurality of sub-burst indicator subcode data is a 4-bit length.

8. The error correction encoding apparatus of claim 5, wherein the error correction encoder generates the error correction code data by error-correction-encoding the user data using a Reed-Solomon encoding method.

9. An error correction decoding method to detect errors in data received from a recording medium, the method comprising:
receiving digital data from a recording medium, in which a plurality of sub-error correction code data and a plurality of sub-burst indicator subcode data are alternately arranged;
generating burst indicator subcode data having the same length as a minimal data unit that is error-correction-decodable by combining every predetermined number of sub-burst indicator subcode data together;
error-correction-decoding the burst indicator subcode data in a predetermined manner;
determining which sub-burst indicator subcode data of the burst indicator subcode data is erroneous by comparing the error-correction-decoded burst indicator subcode data with the burst indicator subcode data yet to be error-correction-decoded; and
determining sub-error correction code data surrounded by two consecutive erroneous sub-burst indicator subcode data as being erroneous.

10. The error correction decoding method of claim 9, wherein the minimal data unit that is error-correction-decodable is 1 byte.

11. The error correction decoding method of claim 10, wherein each of the plurality of sub-burst indicator subcode data is 4-bits and burst indicator subcode data having a 1-byte length is generated by combining two sub-burst indicator subcode data together.

12. The error correction decoding method of claim 9, wherein the burst indicator subcode data is error-correction-decoded using a Reed-Solomon decoding method.

13. An error correction decoding apparatus comprising:
a burst indicator subcode data generator, to receive digital data, in which a plurality of sub-error correction code data and a plurality of sub-burst indicator subcode data are alternately arranged, and to generate burst indicator subcode data having the same length as a minimal data unit that is error-correction-decodable by combining every predetermined number of sub-burst indicator subcode data together;
an error correction decoder to error-correction-decode the burst indicator subcode data in a predetermined manner; and
an error determiner to determine which sub-burst indicator subcode data of the burst indicator subcode data is erroneous by comparing the error-correction-decoded burst indicator subcode data with the burst indicator subcode data yet to be error-correction-decoded, and determines sub-error correction code data surrounded by two consecutive erroneous sub-burst indicator subcode data as being erroneous.

14. The error correction decoding apparatus of claim 13, wherein the minimal data unit that is error-correction-decodable is 1 byte.

15. The error correction decoding apparatus of claim 14, wherein each of the plurality of sub-burst indicator subcode data is 4-bits, and the burst indicator subcode data generator generates burst indicator subcode data having a 1-byte length by combining two sub-burst indicator subcode data together.

16. The error correction decoding apparatus of claim 13, wherein the error correction decoder error-correction-decodes the burst indicator subcode data using a Reed-Solomon decoding method.

17. An error correction encoding and/or decoding method to detect errors in user data on a recording medium, the method comprising:
generating error locating data of a predetermined size to detect errors in the user data;
dividing the error locating data into a plurality of sub-error locating data, each sub-error locating data having a length that is less than a minimal data unit that is error-correction-encodable; and
arranging the plurality of sub-error locating data in each of the error correction code blocks at regular intervals in order to locate erroneous user data, wherein the recording medium includes user data recorded on a block-by-block basis such that each block is an error correction code block.

18. The error correction encoding and/or decoding method of claim 17, wherein the error locating data is burst indicator subcode data that is error-correction-encoded/decoded using a Reed-Solomon decoding/encoding technique.

19. The error correction encoding and/or decoding method of claim 18, wherein each error correction code block is divided at a predetermined location by arranging each sub-error locating data at a predetermined interval of the user data.

20. The error correction encoding and/or decoding method of claim 19, further comprising determining whether any of the sub-error locating data is erroneous by combining together each sub-error locating data into a respective pre-divided error locating data state to be error error-correction-decoded and comparing each error-correction-decoded error locating data with the respective pre-divided error locating data that is not error-correction decoded.

21. The error correction encoding and/or decoding method of claim 20, further comprising detecting which part of error-correction-encoded data is erroneous by determining whether any of the divided error correction code blocks is located between two detected erroneous sub-error locating data, successively, wherein each divided error correction code blocks determined to be successively located between two erroneous sub-error locating data is erroneous.

22. The error correction encoding and/or decoding method of claim 17, wherein the minimal data unit that is error-correction-encodedable and/or decodedable is 1 byte, and the error locating data is divided into a plurality of sub-error locating data each having a length of less than 1 byte.

23. The error correction encoding and/or decoding method of claim 22, wherein each of the sub-error locating data is a 4-bit length.

24. The error correction encoding and/or decoding method of claim 23, wherein the error locating data is generated by error-correction-encoding the user data using a Reed-Solomon technique.

25. The error correction encoding and/or decoding method of claim 24, wherein the Reed-Solomon technique is used to error-correction encode data and/or error-correction decode data on a one byte-by-one byte basis.

26. The error correction encoding and/or decoding method of claim 24, further comprising recording the error-correction encoded data on the recording medium.

27. The error correction encoding and/or decoding method of claim 17, wherein the recording medium is an optical disk.

28. An error correction encoding and/or decoding apparatus to detect errors in user data on a recording medium, the recording medium having user data recorded on a block-by-block basis such that each block is an error correction code block, the apparatus comprising:
   an error correction encoder to generate error locating data of a predetermined size to detect errors present in the user data;
   a sub-data generator to divide the error locating data into a plurality of sub-error locating data, each sub-error locating data having a length that is less than a minimal data unit that is error-correction-encodedable; and
   a data synthesizer to arrange each of the sub-error locating data in each of the error correction code blocks at a predetermined location in order to locate erroneous user data, wherein each error correction code block has one of the sub-error locating data located on each side, respectively.

29. The error correction encoding and/or decoding apparatus of claim 28, wherein the error locating data is burst indicator subcode data that is error-correction-encoded/decoded using a Reed-Solomon decoding/encoding technique.

30. The error correction encoding and/or decoding apparatus of claim 29, wherein each error correction code block is divided at predetermined location by arranging each sub-error locating data at a predetermined location of the user data.

31. The error correction encoding and/or decoding apparatus of claim 30, further comprising a controller to detect which part of error correction encoded data is erroneous, wherein each sub-error locating data is combined into a respective pre-divided error locating data state and error-correction-decoded and compared with the respective pre-divided error locating data that is not error-correction decoded, such that sub-error correction encoded data surrounded by two consecutive erroneous sub-error locating data is erroneous.

32. The error correction encoding and/or decoding apparatus of claim 28, wherein the minimum data unit that is error-correction-encodedable and/or decodable is 1 byte, and each of the sub-error locating data is a length that is less than 1 byte.

33. The error correction encoding and/or decoding apparatus of claim 32, wherein each sub-error locating data is a 4-bit length.

34. The error correction encoding and/or decoding apparatus of claim 33, wherein the error locating data is generated by error-correction-encoding the user data using a Reed-Solomon technique.

35. The error correction encoding and/or decoding apparatus of claim 34, wherein the Reed-Solomon technique is used to error-correction encode data and/or error-correction decode data on a one byte-by-one byte basis.

36. The error correction encoding and/or decoding apparatus of claim 34, further comprising recording the error-correction encoded data on the recording medium.

37. The error correction encoding and/or decoding apparatus of claim 36, wherein the recording medium is an optical disk.

* * * * *

UNITED STATES PATENT AND TRADEMARK OFFICE
CERTIFICATE OF CORRECTION

PATENT NO. : 7,350,133 B2 Page 1 of 1
APPLICATION NO. : 10/869054
DATED : March 25, 2008
INVENTOR(S) : Ki-hyun Kim et al.

It is certified that error appears in the above-identified patent and that said Letters Patent is hereby corrected as shown below:

Column 6, line 52, claim 1 insert --data-- after "code".

Column 7, line 19, claim 6 change "errorcorrection" to --error-correction--.

Signed and Sealed this

Seventeenth Day of June, 2008

JON W. DUDAS
*Director of the United States Patent and Trademark Office*